US012610710B2

(12) United States Patent
Zhou et al.

(10) Patent No.: US 12,610,710 B2
(45) Date of Patent: Apr. 21, 2026

(54) DISPLAY PANEL AND DISPLAY DEVICE

(71) Applicant: HKC CORPORATION LIMITED, Shenzhen (CN)

(72) Inventors: Ting Zhou, Shenzhen (CN); Hailiang Wang, Shenzhen (CN); Jing Li, Shenzhen (CN); Qi Mu, Shenzhen (CN); Laidi Wu, Shenzhen (CN); Tianjun Huang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 528 days.

(21) Appl. No.: 18/360,908

(22) Filed: Jul. 28, 2023

(65) Prior Publication Data

US 2024/0298491 A1     Sep. 5, 2024

(30) Foreign Application Priority Data

Mar. 1, 2023    (CN) .......................... 202310186127.6

(51) Int. Cl.
H10K 59/35          (2023.01)
H10K 59/122         (2023.01)
(Continued)

(52) U.S. Cl.
CPC ......... H10K 59/351 (2023.02); H10K 59/122 (2023.02); H10K 59/131 (2023.02);
(Continued)

(58) Field of Classification Search
CPC .. H10K 59/351; H10K 59/122; H10K 59/131; H10K 59/352; H10K 59/353; H10K 59/38; H10K 59/80516; H10K 59/124
See application file for complete search history.

(56) References Cited

U.S. PATENT DOCUMENTS

2017/0139264 A1*   5/2017   Fu ............................ G06F 3/147
2020/0266257 A1*   8/2020   Fan ...................... H10K 59/173
(Continued)

FOREIGN PATENT DOCUMENTS

CN      114326199      4/2022
CN      115172425      10/2022
(Continued)

OTHER PUBLICATIONS

CNIPA, First Office Action for CN Application No. 202310186127.6, Apr. 12, 2023.
(Continued)

*Primary Examiner* — Kevin Quarterman
(74) *Attorney, Agent, or Firm* — Hodgson Russ LLP

(57)          ABSTRACT

A display panel includes a substrate and a plurality of pixel components formed on the substrate. Each of the pixel components comprises a plurality of sub-pixels, at least one of the sub-pixels is an anti-peeping sub-pixel. Each anti-peeping sub-pixel comprises a normal display part which including a display organic light-emitting layer and a display color filtering layer, and an anti-peeping part which including an anti-peeping organic light-emitting layer and an anti-peeping color filtering layer. The light emitted by the anti-peeping organic light-emitting layer and the light emitted by the display organic light-emitting layer are same in color, and the anti-peeping color filtering layer and the display color filtering layer are different in color. The display color filtering layer allows the light emitted by the anti-peeping organic light-emitting layer and the light emitted by the display organic light-emitting layer to pass through.

20 Claims, 10 Drawing Sheets

(51) Int. Cl.
| | |
|---|---|
| *H10K 59/131* | (2023.01) |
| *H10K 59/38* | (2023.01) |
| *H10K 59/80* | (2023.01) |

(52) U.S. Cl.
CPC ......... *H10K 59/352* (2023.02); *H10K 59/353* (2023.02); *H10K 59/38* (2023.02); *H10K 59/80516* (2023.02)

(56) References Cited

U.S. PATENT DOCUMENTS

| | | | | |
|---|---|---|---|---|
| 2020/0343315 A1* | 10/2020 | Lin | ................. | H10K 59/80522 |
| 2021/0234134 A1* | 7/2021 | Qi | ..................... | H10K 59/8731 |
| 2023/0096638 A1* | 3/2023 | Lou | .................... | H10K 59/122 |
| | | | | 257/40 |
| 2023/0100284 A1* | 3/2023 | Yao | ......................... | G09G 3/20 |
| | | | | 345/55 |

FOREIGN PATENT DOCUMENTS

| | | |
|---|---|---|
| CN | 115273661 | 11/2022 |
| CN | 115377154 | 11/2022 |
| CN | 115528193 | 12/2022 |
| CN | 115633522 | 1/2023 |

OTHER PUBLICATIONS

CNIPA, Second Office Action for CN Application No. 202310186127. 6, May 6, 2023.

\* cited by examiner

Blue Color Filtering
Layer

Green Color Filtering
Layer

Blue Color Filtering
Layer

Wavelength(nm)

222

20b

20c

DISPLAY PANEL AND DISPLAY DEVICE

CROSS-REFERENCE TO RELATED APPLICATIONS

This application claims priority to Chinese Patent Application No. 202310186127.6, filed Mar. 1, 2023, the entire disclosure of which is incorporated herein by reference.

TECHNICAL FIELD

The present application relates to the field of display technologies, and more specifically, to a display panel and a display device.

BACKGROUND ART

OLED (Organic Light-Emitting Diode) display panels have the advantages of lightness, thinness, capability of being bent, high brightness, low power consumption, fast response, high resolution, wide color gamut, and the like, and thus are increasingly used in electronic devices such as TVS, mobile phones, laptops, and the like.

The active light emission characteristics of light-emitting diode enable the OLED display panels to have a wider angle of view, which can provide users with better visual experiences. However, sometimes users hope that the angle of view of the display panel can be adjusted to be small, so as to effectively protect business secrets and personal privacy to avoid commercial losses or embarrassments caused by leakage of screen information. But the display panels with anti-peeping function have a problem of inconvenient switching between normal display and anti-peeping display.

SUMMARY

There are provided a display panel and a display device. The technical solution is as below:

According to a first aspect of the present disclosure, there is provided a display panel, comprising a substrate and a plurality of pixel components formed on the substrate and arranged in an array. Each of the pixel components comprises a plurality of sub-pixels, at least one of the sub-pixels is an anti-peeping sub-pixel, and each anti-peeping sub-pixel comprises:

a normal display part comprising a display organic light-emitting layer and a display color filtering layer. The display color filtering layer is arranged on a side of the display organic light-emitting layer away from the substrate; and an anti-peeping part, at least two opposite sides of the anti-peeping part are provided with a normal display part. The anti-peeping part comprising an anti-peeping organic light-emitting layer and an anti-peeping color filtering layer. The anti-peeping color filtering layer is arranged on a side of the anti-peeping organic light-emitting layer away from the substrate. The light emitted by the anti-peeping organic light-emitting layer and the light emitted by the display organic light-emitting layer are same in color, and the anti-peeping color filtering layer and the display color filtering layer are different in color. The display color filtering layer is configured to allow the light emitted by the anti-peeping organic light-emitting layer and the light emitted by the display organic light-emitting layer to pass through. The anti-peeping color filtering layer is connected to the display color filtering layer.

In a normal display mode, the display organic light-emitting layer and the anti-peeping organic light-emitting layer emit light simultaneously or be lightless simultaneously.

In an anti-peeping mode, one of the display organic light-emitting layer and the anti-peeping organic light-emitting layer emits light, and the other is lightless.

According to a second aspect of the present disclosure, there is provided a display device, including the display panel above and a mainboard, and the mainboard is connected to the display panel.

It should be understood that the general description above and the detailed description below are only exemplary and explanatory, and cannot limit the present disclosure.

BRIEF DESCRIPTION OF THE DRAWINGS

The accompanying drawings herein are incorporated into the specification to constitute a part of this specification, show the embodiments in accordance with the present application, and are used together with the specification to explain the principle of the present application. Apparently, the accompanying drawings in the description below merely illustrate some embodiments of the present application. Those of ordinary skill in the art may also derive other accompanying drawings from these accompanying drawings without creative efforts.

DETAILED DESCRIPTION OF THE EMBODIMENTS

The exemplary embodiments will now be described more fully with reference to the drawings. However, the exemplary embodiments can be implemented in a variety of forms and should not be construed as being limited to the examples set forth herein; rather, these embodiments are provided so that the present application will be more comprehensive and complete, and the concept of example embodiments will be fully communicated to those skilled in the art.

In the present application, the terms "first" and "second" are for descriptive purposes only and are not to be construed as indicating or implying their relative importance or implicitly specifying the number of indicated technical features. Thus, a feature defined with "first" and "second" may explicitly or implicitly include one or more of the features. In the description of the present application, "a plurality of" means two or more, unless expressly specified otherwise.

In the present application, unless otherwise clearly stipulated and limited, the terms such as "assembly", "connection" and the like should be understood in a broad sense, for example, the term "connection" may be a fixed connection or a detachable connection, or integration; may be a mechanical connection, or an electrical connection; may be a direct connection, an indirect connection through an intermediary, or an internal communication of two components or an interaction relation between two components. For those of ordinary skill in the art, the specific meanings of the above terms in the present application can be understood according to specific circumstances.

Furthermore, the described features, structures or characteristics may be combined in any other suitable manner in one or more embodiments. In the description below, some specific details are provided to provide a thorough understanding of the embodiments of the present application. However, those skilled in the art will be aware that the technical solution of the present application may be practiced without one or more of the specific details, or other methods, components, devices, steps, etc., may be employed. In other cases, known methods, devices, implementations or operations are not specified or described in detail to avoid obscuring aspects of the present application.

Embodiment 1

Figure 1:
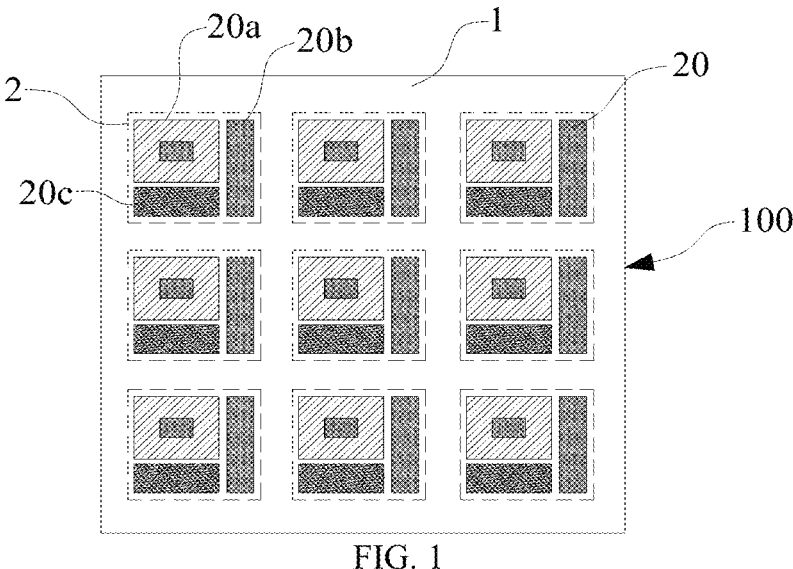
FIG. 1 is a schematic structural diagram of a display panel according to Embodiment 1 or Embodiment 3 of the present application.

As shown in FIG. 1, Embodiment 1 of the present application provides a display panel 100 including a substrate 1 and a plurality of pixel components 2 formed on the substrate 1 and arranged in an array.

For example, the substrate 1 may be, but not limited to, a rigid substrate made of glass, also may be a flexible substrate made of materials such as (PI), etc., that is to say, the display device of the present application may be either a rigid non-bendable panel or a flexible bendable panel.

The plurality of pixel components 2 are sequentially spaced along row and column directions on the substrate 1, and each of the pixel components 2 includes a plurality of sub-pixels 20. At least one of the plurality of sub-pixels 20 is an anti-peeping sub-pixel 20a, and the anti-peeping sub-pixel 20a includes a normal display part 21 and an anti-peeping part 22, at least two opposite sides of the anti-peeping part 22 are provided with a normal display part 21.

Figure 2:
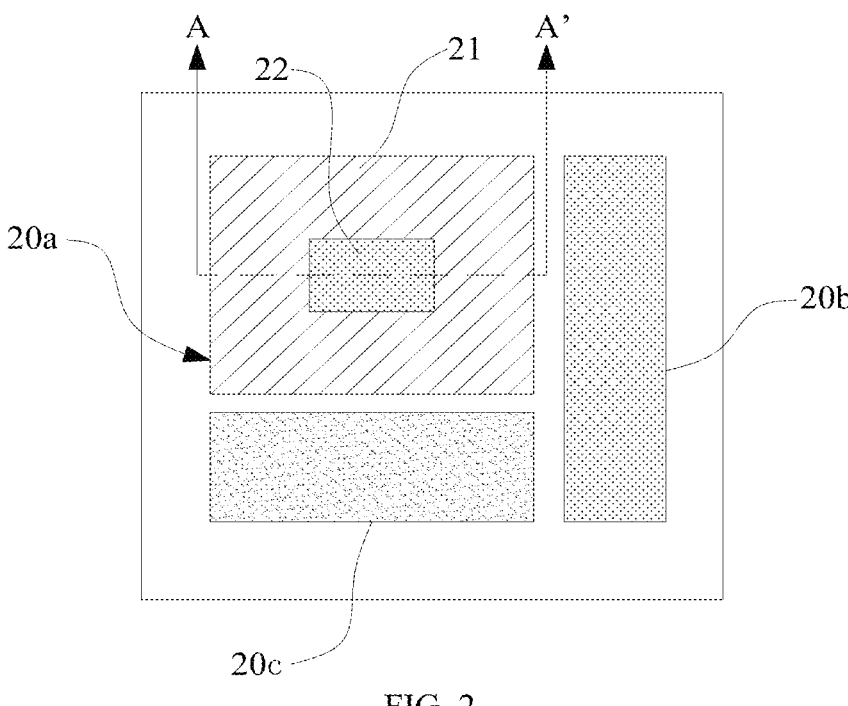
FIG. 2 is a schematic structural diagram of a pixel component according to Embodiment 1 or Embodiment 3 of the present application.

In embodiments of the present application, as shown in FIG. 2, the normal display part 21 is arranged around the anti-peeping part 22, and is connected to the anti-peeping part 22.

Figures 3, 4:
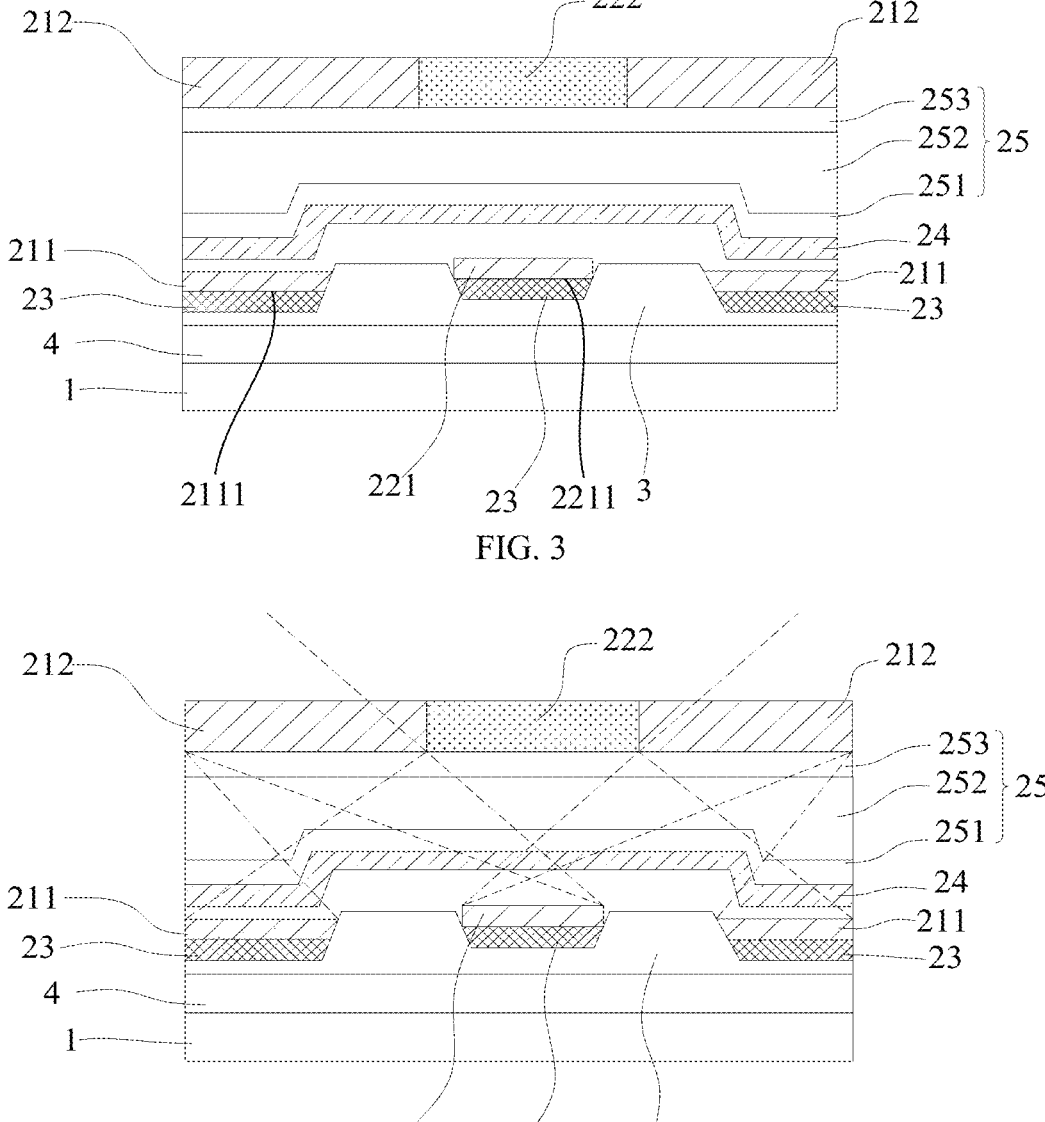
FIG. 3 is a schematic diagram of a cross section at A-A' in FIG. 2.
FIG. 4 shows a light emission direction in a normal mode according to Embodiment 1 or Embodiment 3 of the present application.

As shown in FIG. 2 and FIG. 3, the normal display part 21 includes a display organic light-emitting layer 211 and a display color filtering layer 212, and the display color filtering layer 212 is arranged on a side of the display organic light-emitting layer 211 away from the substrate 1. The anti-peeping part 22 includes an anti-peeping organic light-emitting layer 221 and an anti-peeping color filtering layer 222, and the anti-peeping color filtering layer 222 is arranged on a side of the anti-peeping organic light-emitting layer 221 away from the substrate 1. The light emitted by the anti-peeping organic light-emitting layer 221 and the light emitted by the display organic light-emitting layer 222 are same in color, and the anti-peeping color filtering layer 222 and the display color filtering layer 221 are different in color. The display color filtering layer 212 allows the light emitted by the anti-peeping organic light-emitting layer 221 and the light emitted by the display organic light-emitting layer 211 to pass through, and when the light emitted by the anti-peeping organic light-emitting layer 221 and the light emitted by the display organic light-emitting layer 211 pass through the display color filtering layer 212, the light becomes brighter, the display brightness of the display panel 100 increases, and the anti-peeping organic light-emitting layer 221 may supplement the brightness of the display color filtering layer 212. In addition, the anti-peeping color filtering layer 222 is connected to the display color filtering layer 212 to prevent light from leaking out from the gap between the anti-peeping color filtering layer 222 and the display color filtering layer 212, thereby ensuring normal switching between a normal mode and an anti-peeping mode.

For example, the anti-peeping color filtering layer 222 may be designed to be in a square shape, and the display color filtering layer 212 may be designed to be in a concentric-square shape, the inside edge of the display color filtering layer 212 is connected to the outside edge of the anti-peeping color filtering layer 222. That is, the anti-peeping color filtering layer 222 is connected to the display color filtering layer 212 in a surrounding manner, so as to avoid the occurrence of light leaking out and ensure normal switching between the anti-peeping mode and the normal display mode.

It should be noted that, the display color filtering layer 212 and the anti-peeping color filtering layer 222 may allow light in corresponding colors to pass through. For example, when the display color filtering layer 212 is blue, and the anti-peeping color filtering layer 222 is red, the display color filtering layer 212 allows blue light to pass through, the anti-peeping color filtering layer 222 allows red light to pass through, and light in other colors is not allowed to pass through.

In addition, light emitted by the anti-peeping organic light-emitting layer 221 and light emitted by the display organic light-emitting layer 211 are same in color, when the anti-peeping organic light-emitting layer 221 and the anti-peeping organic light-emitting layer 221 emitting light simultaneously, the anti-peeping organic light-emitting layer 221 can supplement the amount of light to the display organic light-emitting layer 211, ensuring a normal light output of the display panel.

In the embodiments of the present application, the light emitted by the anti-peeping organic light-emitting layer 221 and the light emitted by the display organic light-emitting layer 211 are blue, and due to a low light-emitting efficiency of blue light, the light emitted by the display organic light-emitting layer 221 is supplemented by the anti-peeping organic light-emitting layer 221 to ensure the light emitting amount of the display color filtering layer 212, thereby ensuring the display effect of the display panel.

In addition, by setting the color of the light emitted by the anti-peeping organic light-emitting layer 221 and the anti-peeping organic light-emitting layer 221 to be the same, it is possible to avoid color mixing between the light emitted by the anti-peeping organic light-emitting layer 221 and the light emitted by the display organic light-emitting layer 211 during simultaneous light emission.

Furthermore, the display color filtering layer 212 corresponds to the display organic light-emitting layer 211, and an orthographic projection of each display organic light-emitting layer 211 on the substrate 1 is located in a corresponding orthographic projection of the display color filtering layer 212 on the substrate 1, so that a better absorption effect of the display color filtering layer 212 is ensured, and then a brighter display effect is achieved. An orthographic projection of each anti-peeping organic light-emitting layer 221 on the substrate 1 is located in a corresponding orthographic projection of the anti-peeping color filtering layer 222 on the substrate 1, which can avoid light leakage.

For example, the orthographic projection of the inside edge of the display color filtering layer 212 on the substrate 1 does not overlap with the orthographic projection of the inside edge of the display organic light-emitting layer 211 on the substrate 1, and the orthographic projection of the inside edge of the display color filtering layer 212 on the substrate 1 is closer to the orthographic projection of the anti-peeping organic light-emitting layer 221 on the substrate 1. Accordingly, the outside edge of the anti-peeping color filtering layer 222 is not flush with the outside edge of the anti-peeping organic light-emitting layer 221, and the orthographic projection of the outside edge of the anti-peeping color filtering layer 222 on the substrate 1 is closer to the orthographic projection of the display organic light-emitting layer 211 on the substrate 1.

Furthermore, in a normal mode, the display organic light-emitting layer 211 and the anti-peeping organic light-emitting layer 221 emit light simultaneously or be lightless simultaneously. That is, in a normal mode, the display organic light-emitting layer 211 and the anti-peeping organic light-emitting layer 221 emit light simultaneously or do not emit light simultaneously.

It can be understood that, as shown in FIG. 4, when the display organic light-emitting layer 211 and the anti-peeping organic light-emitting layer 221 emit light simultaneously, since the anti-peeping color filtering layer 222 and the display organic light-emitting layer 211 are different in color, part of the light emitted by the display organic light-emitting layer 211 is filtered out by the anti-peeping color filtering layer 222 and cannot be used to display. Moreover, the anti-peeping organic light-emitting layer 221 is located in the middle of the display organic light-emitting layers 211, and the light emitted by the anti-peeping organic light-emitting layer 221 and the light emitted by the display organic light-emitting layer 211 are same in color; and when the anti-peeping organic light-emitting layer 221 emits light, it can supplement the display color filtering layers 212 on both sides with an amount of emitted light in a corresponding color, so as to ensure the normal light output at a squint large angle of view, and then ensure a normal display at the large angle of view and ensure the reading of information, thereby achieving a normal display.

Accordingly, when the display organic light-emitting layer 211 and the anti-peeping organic light-emitting layer 221 do not emit light simultaneously, that is, when the anti-peeping sub-pixel 20a is not required to participate in color mixing, the display organic light-emitting layer 211 and the anti-peeping organic light-emitting layer 221 in the anti-peeping sub-pixel 20a are turned off simultaneously, and the remaining sub-pixels 20 are used for color mixing to achieve normal display.

Figure 5:
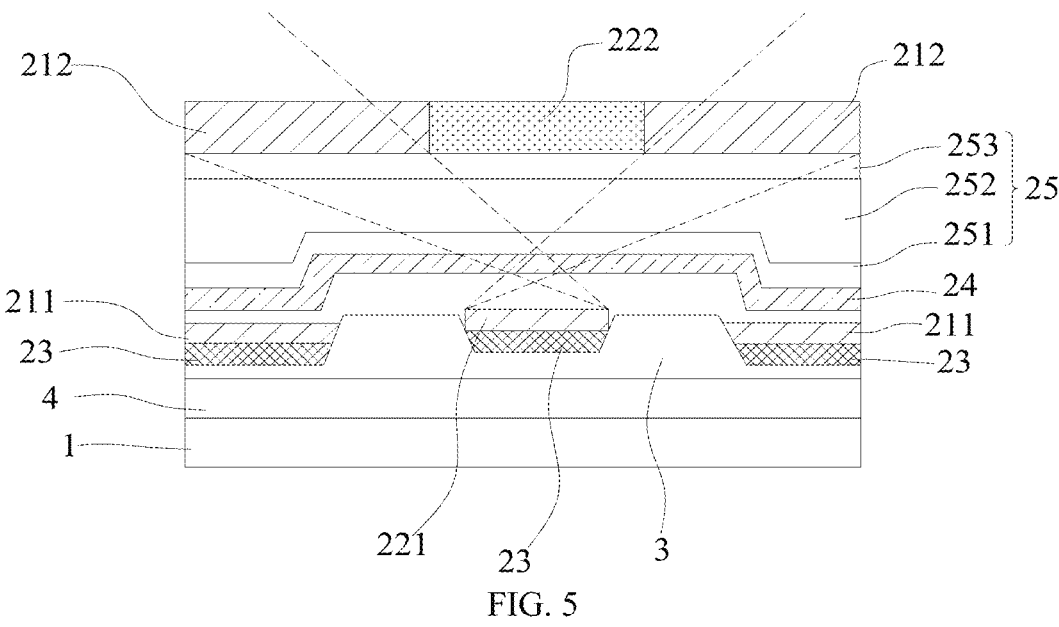
FIG. 5 shows a light emission direction of an anti-peeping organic light-emitting layer in an anti-peeping mode according to Embodiment 1 or Embodiment 3 of the present application.
Figure 6:
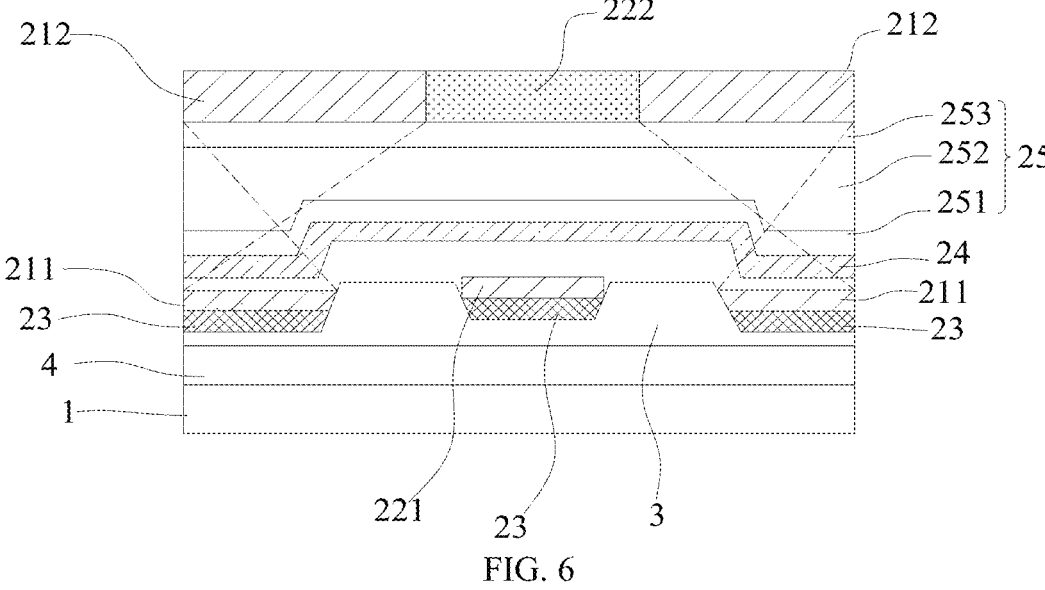
FIG. 6 shows a light emission direction of a display organic light-emitting layer in the anti-peeping mode according to Embodiment 1 or Embodiment 3 of the present application.

As shown in FIG. 5 and FIG. 6, in an anti-peeping mode, one of the display organic light-emitting layer 211 and the anti-peeping organic light-emitting layer 221 emits light, and the other one of the two does not emit light.

It can be understood that, as shown in FIG. 6, when the display organic light-emitting layer 211 emits light while the anti-peeping organic light-emitting layer 221 does not emit light, part of the light emitted by the display organic light-emitting layer 211 pass through the display color filtering layer 212, and the rest is blocked by the anti-peeping color filtering layer 222, so that the light emitting amount of the display color filtering layer 212 is reduced, as a result, a large angle of view display is abnormal, which interferes with the reading of information at the large angle of view, and affects the viewing effect at the large angle of view, thereby achieving anti-peeping.

Accordingly, as shown in FIG. 5, when the display organic light-emitting layer 211 does not emit light while the anti-peeping organic light-emitting layer 221 emits light, the light emitted by the anti-peeping organic light-emitting layer 221 is exported from the display color filtering layer 212, which reduces the light emitting amount of the display color filtering layer 212, so that the light emitting amount at a large angle of view is reduced, as a result, a large angle of view display is abnormal, which interferes with the reading of information at the large angle of view, thereby achieving anti-peeping.

In such a way, according to the present application, the anti-peeping mode and the normal display mode are switched by switching the light-emitting states of the display organic light-emitting layer 211 and the anti-peeping organic light-emitting layer 221, therefor, the switching method is simpler and more convenient.

It can be understood that, in the present application, the anti-peeping color filtering layer 222 and the display organic light-emitting layer 211 are different in color refers to the light allowed to pass through the anti-peeping color filtering layer 222 and the light emitted by the display organic light-emitting layer 211 are different in color. Corresponding understanding should be given to other descriptions of the same or different colors in this application. For example, the colors of the display organic light-emitting layer 211, the anti-peeping organic light-emitting layer 221, and the display color filtering layer 212 are the same refers to the color of the light emitted by the display organic light-emitting layer 211, and the color of the light emitted by the anti-peeping organic light-emitting layer 221 are the same as the color of the light allowed to pass through the display color filtering layer 212.

Furthermore, as shown in FIG. 2, in the embodiments of the present application, each of the pixel components 2 includes three sub-pixels 20 spaced apart from each other. The three sub-pixels 20 are the first sub-pixel 20*b*, the second sub-pixel 20*c* and the anti-peeping sub-pixel 20*a* described above. Wherein, the light emitted by the first sub-pixel 20*b*, the light emitted by the second sub-pixel 20*c* and the light emitted by the anti-peeping sub-pixel 20*a* are different in color, and the anti-peeping sub-pixel 20*a* includes the above-mentioned normal display part 21 and the anti-peeping part 22.

For example, the display color filtering layer of the first sub-pixel 20*b* is red, and the display color filtering layer of the second sub-pixel 20*c* is green. The anti-peeping sub-pixel 20*a* includes the normal display part 21 and the anti-peeping part 22, and the normal display part 21 are arranged around the anti-peeping part 22. In the normal display part 21, the display color filtering layer 212 and the display organic light-emitting layer 211 are blue; and in the anti-peeping part 22, the anti-peeping color filtering layer 222 is red, and the anti-peeping organic light-emitting layer 221 is blue. In addition, the center of the normal display part 21 and the center of the anti-peeping part 22 are located on a same center line. And the center of the anti-peeping organic light-emitting layer 221 and the center of the anti-peeping color filtering layer 222 are located on a same center line, so that the amounts of light emitted by the anti-peeping organic light-emitting layer 221 to both sides are the same.

In a normal display mode, when the anti-peeping organic light-emitting layer 221 and the anti-peeping organic light-emitting layer 221 emitting light simultaneously, the anti-peeping sub-pixel 20*a* is blue at a squint large angle of view, while, when the anti-peeping organic light-emitting layer 221 and the anti-peeping organic light-emitting layer 221 do not emit light simultaneously, the anti-peeping sub-pixel 20*a* is black at a squint large angle of view. During simultaneous light emission, the anti-peeping organic light-emitting layer 221 provides a supplementary light emitting amount to the display color filtering layers on both sides to ensure the light emitting amount at a squint angle of view, and then ensure the normal light emitting amount at the large angle of view, thereby achieving normal squinting.

When the display organic light-emitting layer 211 emits light while the anti-peeping organic light-emitting layer 221 does not emit light, the anti-peeping mode is turned on. The light emitting amount of the display color filtering layer 212 is reduced, so that the light emitting amount of the whole display panel 100 is reduced, as a result, a large angle of view display is abnormal, which interferes with the reading of information at the large angle of view and affects the viewing effect at the large angle of view, thus, causing the squint visual effect of the display panel 100 becomes yellow.

When the display organic light-emitting layer 211 does not emit light while the anti-peeping organic light-emitting layer 221 emits light, the anti-peeping mode is turned on. The light emitted by the anti-peeping organic light-emitting layer 221 is transmitted out from the display color filtering layer 212, but since there is few light emitted by the anti-peeping organic light-emitting layer 221, the squint visual effect of the display panel 100 is slightly blue.

It should be understood that the display color filtering layer 212 and the anti-peeping color filtering layer 222 are connected, which may prevent light leakage between the display color filtering layer 212 and the anti-peeping color filtering layer 222, thus ensuring the switching between the anti-peeping mode and the normal mode.

It should be understood that, in the present application, the display color filtering layer of the first sub-pixel 20*b* is red refers to that the display color filtering layer of the first sub-pixel 20*b* allows red light to pass through. The display color filtering layer of the second sub-pixel 20*c* is green refers to that the display color filtering layer of the second sub-pixel 20*c* allows green light to pass through. The display color filtering layer 212 is blue refers to that the display color filtering layer 212 allows blue light to pass through. The display organic light-emitting layer 211 is blue refers to that the light emitted by the display organic light-emitting layer 211 is blue. The anti-peeping organic light-emitting layer 221 is blue refers to that the light emitted by the anti-peeping organic light-emitting layer 221 is blue. The anti-peeping color filtering layer 222 is red refers to that the anti-peeping color filtering layer 222 allows red light to pass through. Corresponding understanding should be given to the descriptions of the colors of the anti-peeping sub-pixels 20*a*, first sub-pixel 20*b*, and second sub-pixel 20*c* and their related components in this application. For example, the first sub-pixel 20*b* is red refers to that the light emitted by the first sub-pixel 20*b* is red.

Figure 7:
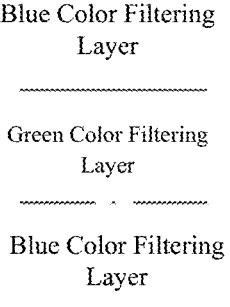
FIG. 7 shows penetration spectra of color filtering layers in different colors according to Embodiment 1, Embodiment 2 or Embodiment 3 of the present application.
Figure 7:
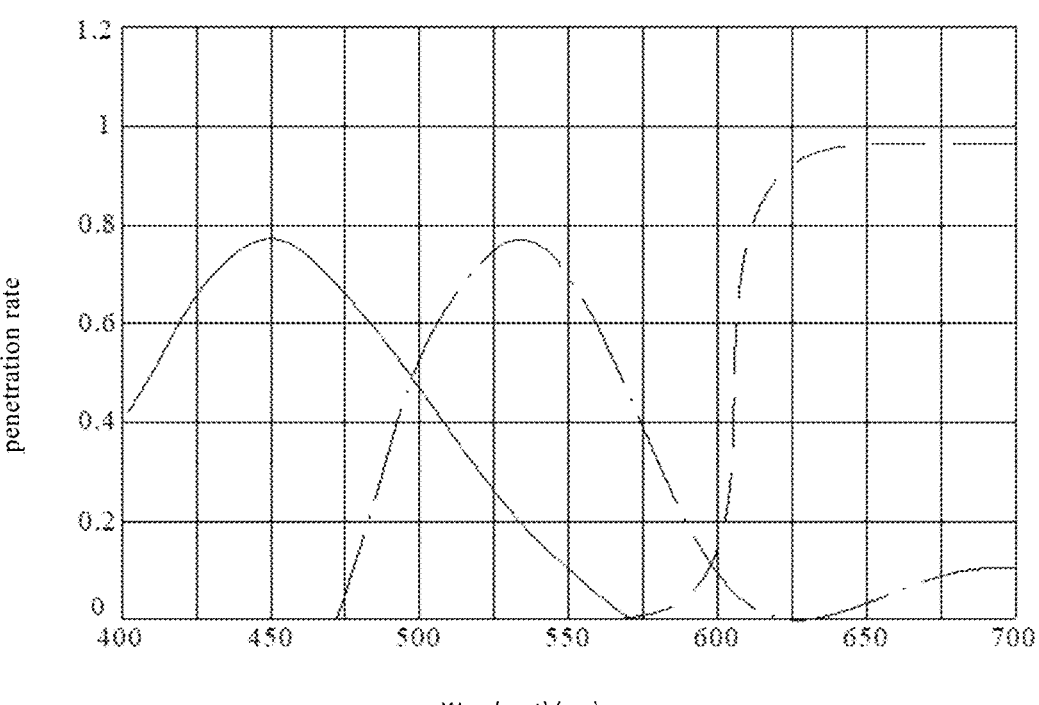

It is worth mentioning that, as shown in FIG. 7, the color-resist penetration rates of the red color filtering layer and the blue color filtering layer are different at a same wavelength, and at a certain wavelength, the penetration rate of each of the two is 0, that is, there is no light passing through. For example, at a wavelength of 450 nm, the penetration rates of the blue color filtering layer and the red color filtering layer are 0.75 and 0 respectively; at a wavelength of 570 nm, the penetration rates of the blue color filtering layer and the red color filtering layer are 0 respectively; and at a wavelength of 650 nm, the penetration rates of the blue color filtering layer and red color filtering layer are 0 and 0.9 respectively. Through the different penetration rates of the two at different wavelengths, it can be ensured that blue light cannot leak out of the red anti-peeping color filtering layer 222, so that a good anti-penetration effect may be achieved, thereby ensuring better anti-peeping effects. Therefore, the normal display part 21 and the anti-peeping part 22 are set in blue and red respectively.

Figure 8:
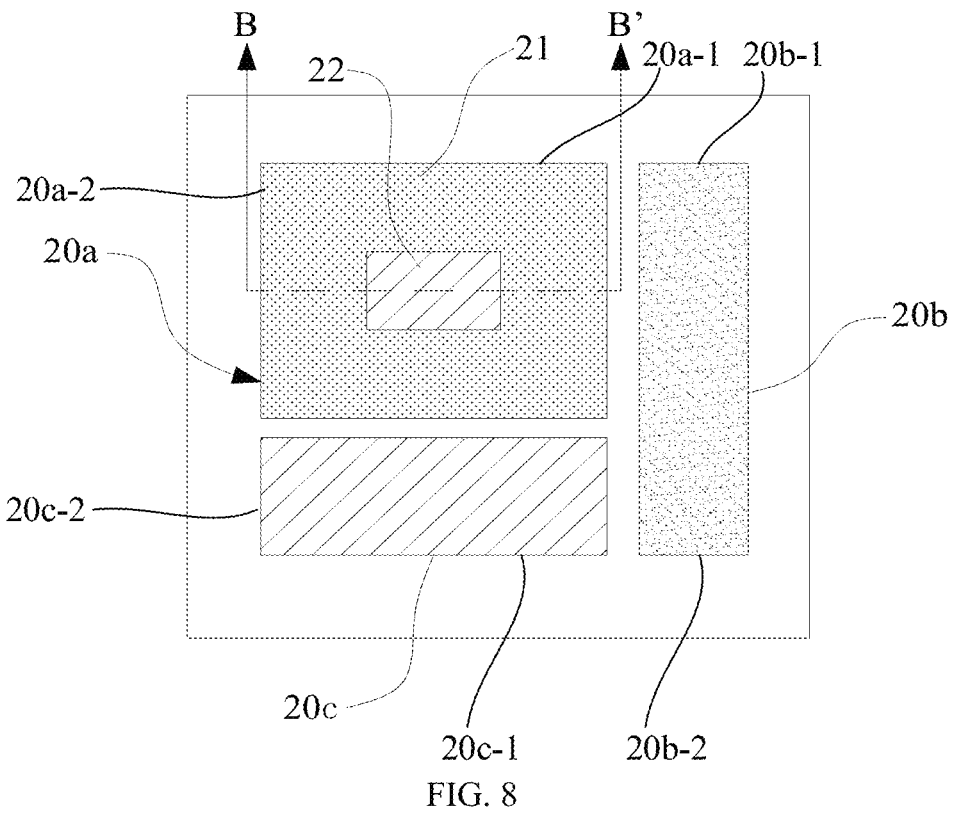
FIG. 8 is a schematic structural diagram showing that a display color filtering layer of a normal display part is red and an anti-peeping color filtering layer is blue according to Embodiment 1 or Embodiment 3 of the present application.
Figure 9:
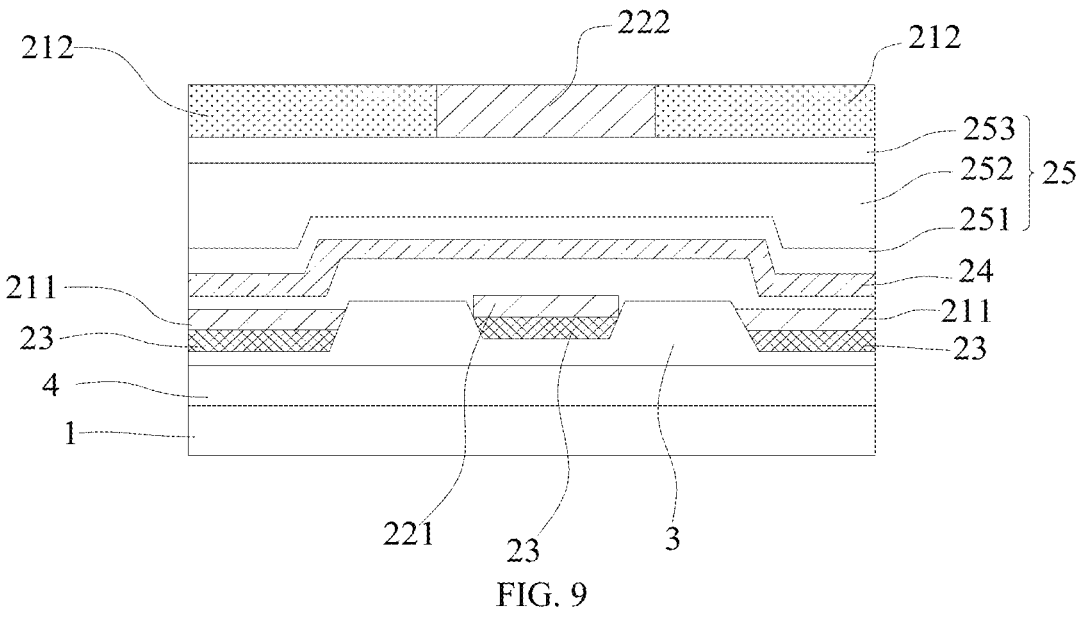
FIG. 9 is a schematic diagram of a cross section at B-B' in FIG. 8.

That is, in some embodiments, as shown in FIG. 8 and FIG. 9, the colors of the normal display part 21 and the anti-peeping part 22 can be exchanged, in other words, the normal display part 21 is red, and the anti-peeping part 22 is blue. Correspondingly, the display organic light-emitting layer 211, the anti-peeping organic light-emitting layer 221 and the display color filtering layer 212 are all red, while the anti-peeping color filtering layer 222 is blue. In addition, the first sub-pixel 20*b* is green, and the second sub-pixel 20*c* is blue.

Furthermore, the anti-peeping sub-pixel 20*a* and the second sub-pixel 20*c* are arranged in sequence in a same column, the first sub-pixel 20*b* is located in a column adjacent to the column in which the second sub-pixel 20*c* and the anti-peeping sub-pixel 20*a* are located, and the first sub-pixel 20*b* is arranged opposite to the anti-peeping sub-pixel 20*a* and the second sub-pixel 20*c*, which can reduce the space occupied by the sub-pixel 20. The arrangement of the corresponding positions between the anti-peeping sub-pixel 20*a*, the first sub-pixel 20*b* and the second sub-pixel 20c can improve the color mixing purity, thereby ensuring the light purity of the display panel 100.

For example, the edge line 20a-1 of the anti-peeping sub-pixel 20a away from the second sub-pixel 20c is flush with the edge line 20b-1 of the first sub-pixel 20b, and the edge line 20c-1 of the second sub-pixel 20c away from the anti-peeping sub-pixel 20a is flush with the other edge line 20b-2 of the first sub-pixel 20b, and the edge line 20c-2 of the second sub-pixel 20c away from the first sub-pixel 20b is flush with the edge line 20a-2 of the anti-peeping sub-pixel 20a to ensure normal light mixing.

It is worth mentioning that the anti-peeping color filtering layer 222 and the display color filtering layer of the sub-pixel 20 which has same color as that of the anti-peeping color filtering layer 222 are arranged in a same layer.

It should be understood that in the present application, "arranged in a same layer" refers to a layer structure formed by forming a film layer for formation of specific graphics by means of a same film forming process and then employing a same mask by means of a single composition process. That is, a single composition process corresponds to a mask. According to different specific graphics, the single composition process may include a plurality of exposure, development or etching processes, and the specific graphics in the formed layer structure may be continuous or discontinuous, and these specific graphics may be at different heights or have different thicknesses, thereby simplifying the production process, saving the manufacturing cost and improving the production efficiency.

For example, when the anti-peeping color filtering layer 222 is red, the first sub-pixel 20b is red, the second sub-pixel 20c is green and the display color filtering layer 212 of the anti-peeping sub-pixel 20a is blue. The anti-peeping color filtering layer 222 and the display color filtering layer of the first sub-pixel 20b are arranged in a same layer. In other words, when preparing the display color filtering layer of the first sub-pixel 20b, preparing the anti-peeping color filtering layer 222 of the anti-peeping part 22 at the same time.

For another example, when the anti-peeping color filtering layer 222 is blue, the first sub-pixel 20b is green, the second sub-pixel 20c is blue and the display color filtering layer 212 of the anti-peeping sub-pixel 20a is red, the anti-peeping color filtering layer 222 and the display color filtering layer of the second sub-pixel 20c are arranged in a same layer. In other words, when preparing the display color filtering layer of the second sub-pixel 20c, preparing the anti-peeping color filtering layer 222 of the anti-peeping part 22 at the same time.

Furthermore, the display panel 100 is prepared using COE technology, that is, the above-mentioned display color filtering layer 212 is formed on the light-emitting side of a light-emitting diode, but in the embodiments of the present application, no black matrix (BM) design is adopted between adjacent color filtering layers. However, in order to avoid the problem of color mixing, the red color filtering layer and the blue color filtering layer are overlapped when the display color filtering layer 212 is prepared. Since the penetration rates of the red color filtering layer and the blue color filtering layer are opposite, the mode of overlapping the red color filtering layers and blue color filtering layers may provide an excellent anti-penetration effect.

Figure 10:
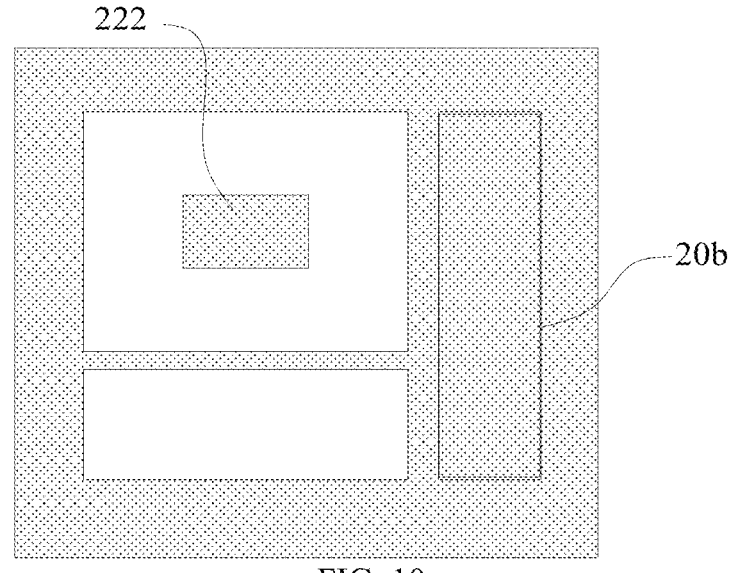
FIG. 10 is a schematic diagram of formation of a red color filtering layer according to Embodiment 1 or Embodiment 2 of the present application.
Figure 11:
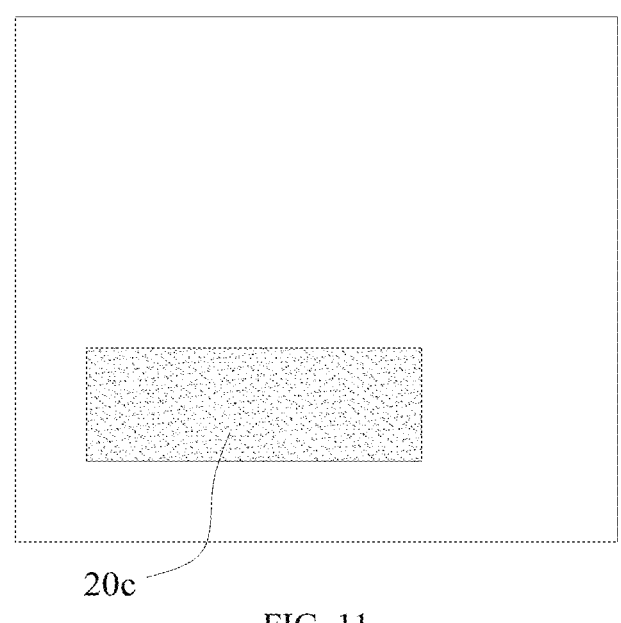
FIG. 11 is a schematic diagram of formation of a green color filtering layer according to Embodiment 1 or Embodiment 2 of the present application.
Figure 12:
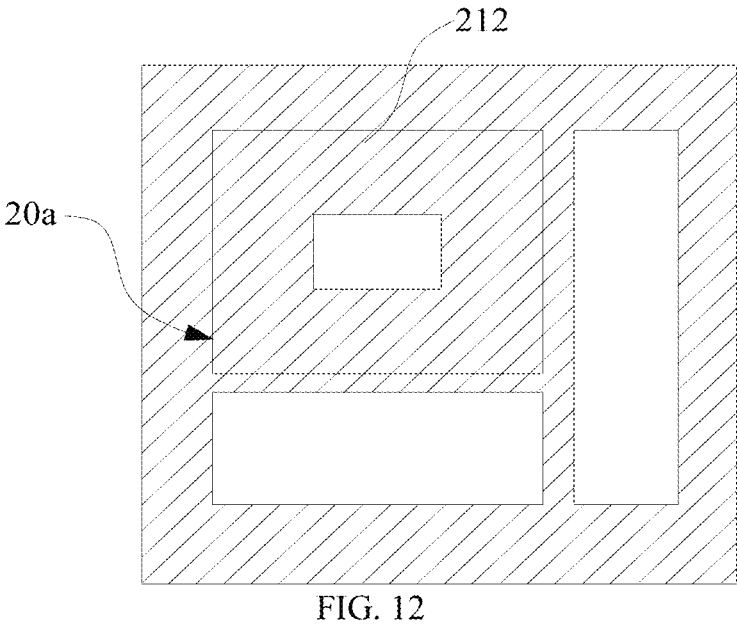
FIG. 12 is a schematic diagram of formation of a blue color filtering layer according to Embodiment 1 or Embodiment 2 of the present application.

For example: when the first sub-pixel 20b is red, the second sub-pixel 20c is green, the display color filtering layer 212 of the anti-peeping sub-pixel 20a is blue, and the anti-peeping color filtering layer 222 of the anti-peeping sub-pixel 20a is red, firstly, as shown in FIG. 10, the red color filtering layer of the first sub-pixel 20b and the anti-peeping color filtering layer 222 of the anti-peeping part 22 are obtained by performing coating, curing and patterning on the light-emitting side of the organic light-emitting layer successively, and an opening area for green color filtering layer of the second sub-pixel 20c is reserved and an opening area for the display color filtering layer 212 of the normal display part 21 in the anti-peeping sub-pixel 20a is reserved, and a red color filtering layer is also coated on the non-opening area; secondly, as shown in FIG. 11, the green color filtering layer of the second sub-pixel 20c is obtained through coating, curing and patterning; then, as shown in FIG. 12, the display color filtering layer 212 of the normal display part 21 of the anti-peeping sub-pixel 20a is obtained through coating, curing and patterning, and a blue color filtering layer is coated on the non-opening area, and the blue color filtering layer overlaps with the red color filtering layer. That is to say, in the non-opening area, the mode of overlapping the red color filtering layers and blue color filtering layers may avoid the problem of color mixing between adjacent sub-pixels 20, thereby ensuring normal display. In addition, by overlapping the red color filtering layers and blue color filtering layers, a black matrix (BM) process of COE and a corresponding mask may be eliminated, thus saving the manufacturing cost.

Furthermore, as shown in FIG. 3, each of the normal display part 21 and each of the anti-peeping part 22 includes an anode 23 and a cathode 24 formed by stacking in sequence, respectively.

The anode 23 of the normal display part 21 is arranged on a side of the display organic light-emitting layer 211 adjacent to the substrate 1, and the cathode 24 of the normal display part 21 is arranged on a side of the display organic light-emitting layer 211 away from the substrate 1. The anode 23 of the anti-peeping part 22 is arranged on a side of the anti-peeping organic light-emitting layer 221 adjacent to the substrate 1, and the cathode 24 of the anti-peeping part 22 is arranged on a side of the anti-peeping organic light-emitting layer 221 away from the substrate 1.

The anodes 23 in the display organic light-emitting layer 211 and the anti-peeping organic light-emitting layer 221 are spaced apart from each other, and the display organic light-emitting layer 211 and the anti-peeping organic light-emitting layer 221 are driven independently of each other, so that the light-emitting states may be controlled, thus enabling switching between the normal display mode and the anti-peeping display mode expediently.

It is worth mentioning that the anode 23 may be made of indium tin oxide (ITO), indium zinc oxide (IZO), zinc oxide (ZnO), indium oxide ($In_2O_3$), or the like.

Figure 13:
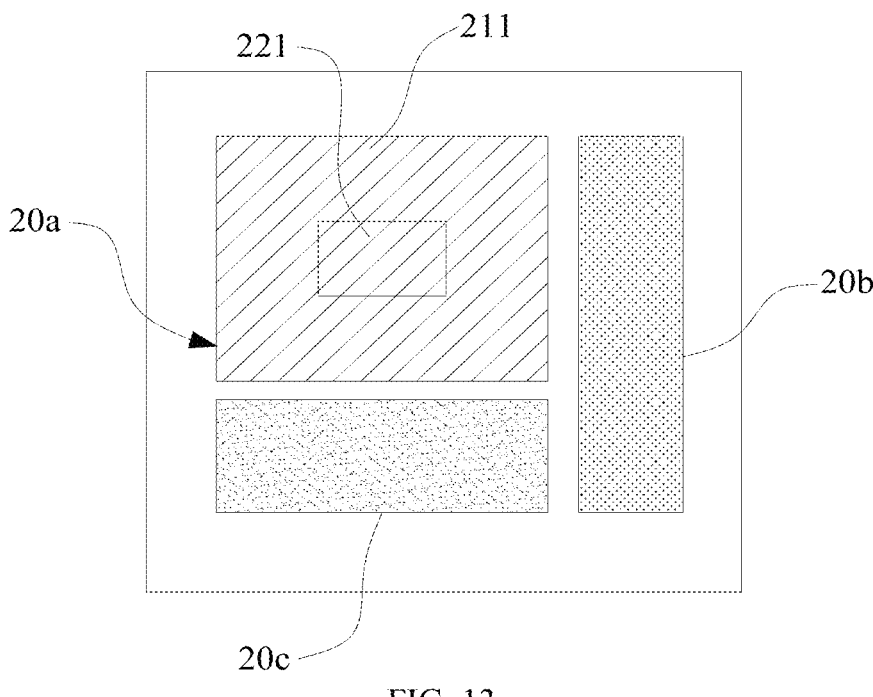
FIG. 13 is a schematic diagram of formation of an organic light-emitting part in each of the sub-pixels according to Embodiment 1 or Embodiment 2 of the present application.

In addition, as shown in FIG. 13, since the light emitted by the display organic light-emitting layer 211 and the light emitted by the anti-peeping organic light-emitting layer 221 are same in color, the display organic light-emitting layer 211 and the anti-peeping organic light-emitting layer 221 may be vaporized with different openings of a same mask, so that the manufacturing process is reduced, thereby reducing the manufacturing cost.

The cathode 24 in the normal display part 21 may be formed after the formation of the display organic light-emitting layer 211 and may be in contact with the display organic light-emitting layer 211. The cathode 24 in the anti-peeping part 22 may be formed after the formation of the anti-peeping organic light-emitting layer 221 and may be in contact with the anti-peeping organic light-emitting layer 221. The cathodes 24 of the displaying organic light-emitting layer 211 and the cathodes 24 of the anti-peeping organic light-emitting layer 221 may be connected with each other to form a whole-surface electrode to reduce the processing cost. The cathode 24 may be a metal cathode 24, for example, made of a mixture of Ag and Mg.

It should be understood that, the normal display part 21 and the anti-peeping part 22 may also include a hole injection layer, a hole transport layer, an electron transport layer and an electron injection layer which are stacked successively, wherein the hole injection layer is in contact with the anode 23, and the electron injection layer is in contact with the cathode 24, but the foregoing is not limited to this. A light emitting diode may also only include a hole transport layer, an organic light-emitting layer and an electron transport layer, or with other structures, which can be determined according to actual needs.

Furthermore, the anodes 23 of the anti-peeping part 22 can be designed to be in a single point or multiple point shape, or can be designed in a point shape or line shape.

The anodes 23 of the plurality of anti-peeping parts 22 are connected to each other. It can be understood that, the anodes 23 of the anti-peeping part 22 in the whole display panel 100 may be connected with each other to achieve simultaneous opening and closing, therefore, the switching mode is simple and the manufacturing cost is reduced. It can also be understood that, the anodes 23 of the anti-peeping parts 22 in a region are connected with each other to achieve simultaneous opening and closing of that the anti-peeping organic light-emitting layers in this region.

In addition, the anodes 23 in one anti-peeping part 22 are independent of each other, so that the anode 23 in one pixel component 2 can be independently regulated, thus, the regulation mode is more precise.

Furthermore, as shown in FIG. 3, the pixel component 2 also includes an encapsulation layer 25 located between the cathode 24 and the display color filtering layer 212. The encapsulation layer 25 includes a first inorganic encapsulation layer 251, an organic encapsulation layer 252 and a second inorganic encapsulation layer 253 which are stacked in sequence. The first inorganic encapsulation layer 251 is located on a side of the cathode 24 away from the substrate 1.

It should be noted that, the materials of the first inorganic encapsulation layer 251 and the second inorganic encapsulation layer 253 include at least one of silicon oxides, silicon nitrides, silicon oxynitrides and aluminium oxides. The first inorganic encapsulation layer 251 and the second inorganic encapsulation layer 253 are configured to isolate water and oxygen in external environments to protect the light emitting diode.

In addition, the materials of the organic encapsulation layer 252 may include epoxy resin, Parylene, etc.

It is worth mentioning that, the first inorganic encapsulation layer 251, the organic encapsulation layer 252 and the second inorganic encapsulation layer 253 are located on the light-emitting side of the light emitting diode.

When preparing the display panel 100, the first inorganic encapsulation layer 251 is formed firstly. The thickness of the first inorganic encapsulation layer 251 is 1000 A-10,000 A, for example, the thickness of the first inorganic encapsulation layer 251 is 1000 A, 2000 A, 3000 A, 4000 A, 5000 A, 6000 A, 7000 A, 8000 A, 9000 A, 10000 A. The organic encapsulation layer 252 is formed on the first inorganic encapsulation layer 251, and the thickness of the organic encapsulation layer 252 is 6-14 µm, such as 6 µm, 7 µm, 8 µm, 9 µm, 10 µm, 11 µm, 12 µm, 13 µm, and 14 µm. The second inorganic encapsulation layer 253 is formed on the organic encapsulation layer 252, and the thickness of the second inorganic encapsulation layer 253 may be the same as that of the first inorganic encapsulation layer 251.

It is worth mentioning that, as shown in FIG. 3, the display panel 100 also includes a pixel definition layer 3 and a drive circuit layer 4 that are arranged on the substrate 1. The display organic light-emitting layer 211 and the anti-peeping organic light-emitting layer 221 are located on a side of the pixel definition layer 3 away from the substrate 1, and the display organic light-emitting layer 211 and the anti-peeping organic light-emitting layer 221 are separated by the pixel definition layer 3 to prevent light mixing. In addition, the drive circuit layer 4 may be formed on the substrate 1 before the formation of the pixel definition layer 3, and the drive circuit layer 4 may include circuit structures such as a thin film transistor and a wire to drive the light-emitting diode mentioned above to emit light, which will not be described in detail here.

The pixel definition layer 3 may be made of materials such as PI.

The bottom 2211 of the anti-peeping organic light-emitting layer 221 is higher than the bottom 2111 of the display organic light-emitting layer 211. That is, the plane where the bottom 2211 of the anti-peeping organic light-emitting layer 221 is located is higher than the plane where the bottom 2111 of the display organic light-emitting layer 211 is located. The anti-peeping organic light-emitting layer 221 is closer to the plane where the anti-peeping color filtering layer 222 and the display color filtering layer 212 are located compared to the display organic light-emitting layer 211.

By controlling the height of the region corresponding to the anti-peeping organic light-emitting layer 221 and the height of the region corresponding to the display organic light-emitting layer 211 of the pixel definition layer 3, and setting the anti-peeping organic light-emitting layer 221 and the display organic light-emitting layer 211 are not in the same layer, the distance between the anti-peeping organic light-emitting layer 221 and color filtering layer, and the distance between the display organic light-emitting layer 211 and color filtering layer are different. This results in a larger visual angle of the light emitted by the anti-peeping organic light-emitting layer 221 compared to the light emitted by the display organic light-emitting layer 211, thereby achieving switching of the viewing range and improving the anti-peeping effects.

Embodiment 2

Figures 14, 15:
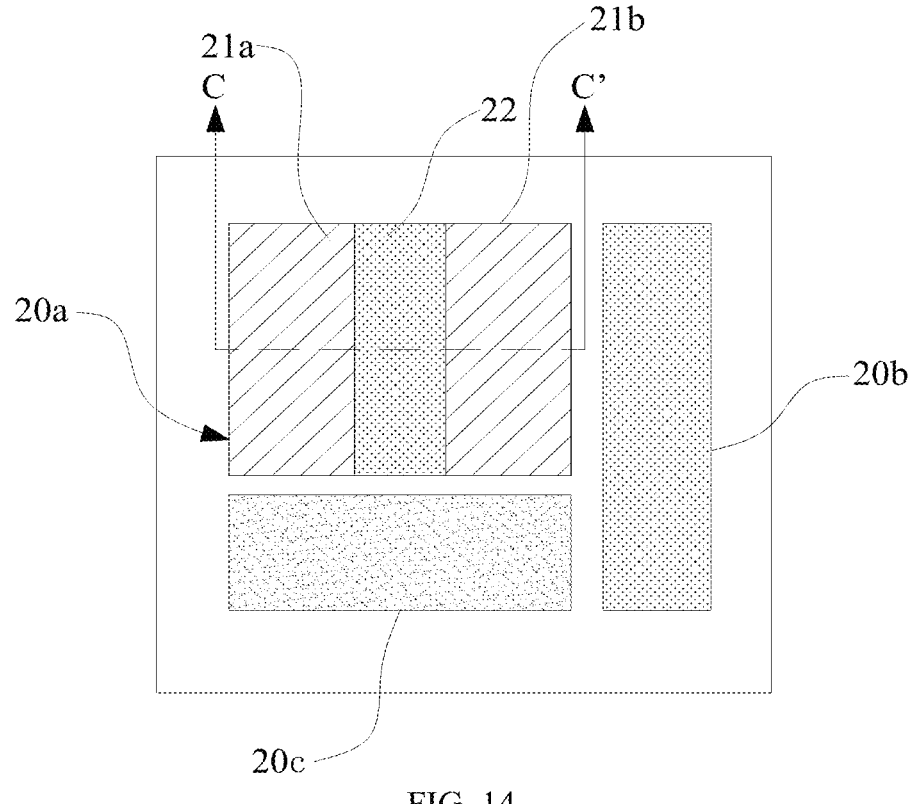
FIG. 14 is a schematic structural diagram of a normal display part disposed on both sides of an anti-peeping part according to Embodiment 2 or Embodiment 3 of the present application.
FIG. 15 is a schematic diagram of a cross section at C-C' in FIG. 14.

As shown in FIG. 14, Embodiment 2 differs from Embodiment 1 of the present application in that a first normal display part 21a and a second normal display part 21b are arranged on both sides of the anti-peeping part 22, respectively.

As shown in FIG. 15, the first normal display part 21a is provided with a first display organic light-emitting layer 211a, and the second normal display part 21b is provided with a second display organic light-emitting layer 211b, the anti-peeping part 22 is provided with an anti-peeping organic light-emitting layer 221, and the anti-peeping organic light-emitting layer 221 is arranged between the first display organic light-emitting layer 211a and the second display organic light-emitting layer 211b. Light emitted by the anti-peeping organic light-emitting layer 221, light emitted by the first display organic light-emitting layer 211a and light emitted by the second display organic light-emitting layer 211b are same in color, so the anti-peeping organic light-emitting layer 221 may supplement the first display organic light-emitting layer 211a and the second display organic light-emitting layer 211*b* with a light emitting amount during simultaneous light emission; and the use of the same color can avoid color mixing between the anti-peeping organic light-emitting layer 221 and the first display organic light-emitting layer 211*a*, or between the anti-peeping organic light-emitting layer 221 and the second display organic light-emitting layer 211*b*.

As shown in FIG. 15, the first normal display part 21 is provided with a first display color filtering layer 212*a*, and the second normal display part 21*b* is provided with a second display color filtering layer 212*b*, and the anti-peeping part 22 is provided with an anti-peeping color filtering layer 222, and the anti-peeping organic light-emitting layer 221 is arranged between the first display color filtering layer 212*a* and the second display color filtering layer 212*b* and connected to the first display color filtering layer 212*a* and the second display color filtering layer 212*b*. The anti-peeping color filtering layer 222 differs from the first display color filtering layer 212*a* and the second display color filtering layer 212*b* in color, and the first display color filtering layer 212*a*, the second display color filtering layer 212*b*, the anti-peeping organic light-emitting layer 221, the first display organic light-emitting layer 211*a* and the second display organic light-emitting layer 211*b* are same in color.

Moreover, the first display color filtering layer 212*a* corresponds to the first display organic light-emitting layer 211*a*, the second display color filtering layer 212*b* corresponds to the second display organic light-emitting layer 211*b*, and the anti-peeping color filtering layer 222 corresponds to the anti-peeling organic light-emitting layer 221.

For example, an orthographic projection of the first display organic light-emitting layer 211*a* on the substrate 1 is located in an orthographic projection of the first display color filtering layer 212*a* on the substrate 1; accordingly, an orthographic projection of the second display organic light-emitting layer 211*b* on the substrate 1 is located in an orthographic projection of the second display color filtering layer 212*b* on the substrate 1; accordingly, an orthographic projection of the anti-peeping organic light-emitting layer 221 on the substrate 1 is located in an orthographic projections of the anti-peeping color filtering layer 222 on the substrate 1.

Figure 16:
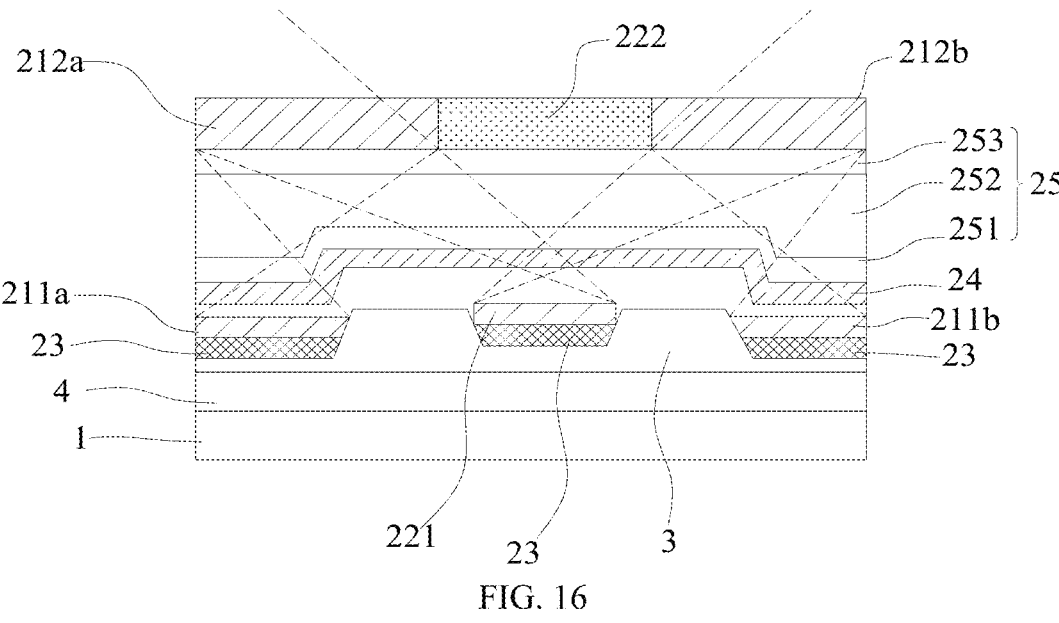
FIG. 16 shows a light emission direction in the normal mode according to Embodiment 2 or Embodiment 3 of the present application.

Furthermore, as shown in FIG. 16, in a normal mode, the first display organic light-emitting layer 211*a*, the second display organic light-emitting layer 211*b* and the anti-peeping organic light-emitting layer 221 emit light simultaneously or do not emit light simultaneously.

It can be understood that, as shown in FIG. 16, when the first display organic light-emitting layer 211*a*, the second display organic light-emitting layer 211*b* and the anti-peeping organic light-emitting layer 221 emit light simultaneously, since the anti-peeping color filtering layer 222 differs from the first display organic light-emitting layer 211*a* and the second display organic light-emitting layer 211*b* in color, part of the light emitted by the first display organic light-emitting layer 211*a* and the second display organic light-emitting layer 211*b* are filtered out by the anti-peeping color filtering layer 222 and cannot be used for display. Moreover, since the anti-peeping organic light-emitting layer 221 is arranged between the first display organic light-emitting layer 211*a* and the second display organic light-emitting layer 211*b*, and the light emitted by the anti-peeping organic light-emitting layer 221 is the same as the light emitted by the first display organic light-emitting layer 211*a* and the light emitted by the second display organic light-emitting layer 211*b* in color, the anti-peeping organic light-emitting layer 221, when emitting light, may supplement the first display color filtering layer 212*a* and the second display color filtering layer 212*b* with a light emitting amount, so as to ensure a normal light emitting amount at a squint large angle of view, and then ensure a normal display at the large angle of view and ensure the reading of information, thereby achieving a normal display.

Accordingly, when the first display organic light-emitting layer 211*a*, the second display organic light-emitting layer 211*b* and the anti-peeping organic light-emitting layer 221 do not emit light simultaneously, that is, when this sub-pixel 20 is not required to participate in color mixing, the first display organic light-emitting layer 211*a*, the second display organic light-emitting layer 211*b* and the anti-peeping organic light-emitting layer 221 in the sub-pixel 20 are turned off simultaneously, and color mixing is performed by use of the remaining sub-pixels 20 to achieve normal display.

Figure 17:
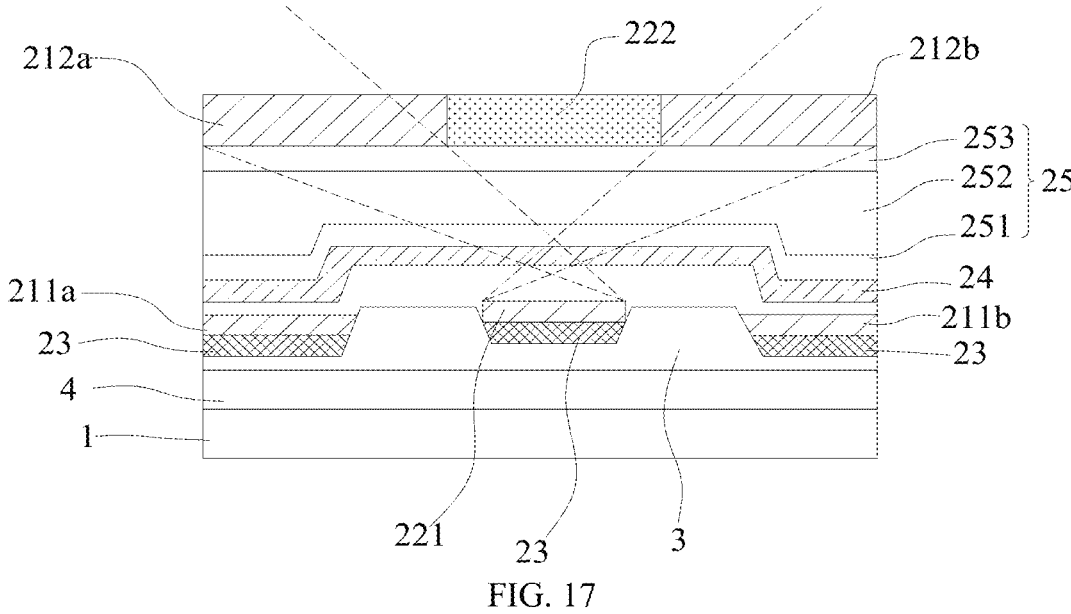
FIG. 17 shows a light emission direction of the anti-peeping organic light-emitting layer in the anti-peeping mode according to Embodiment 2 or Embodiment 3 of the present application.
Figures 18, 19:
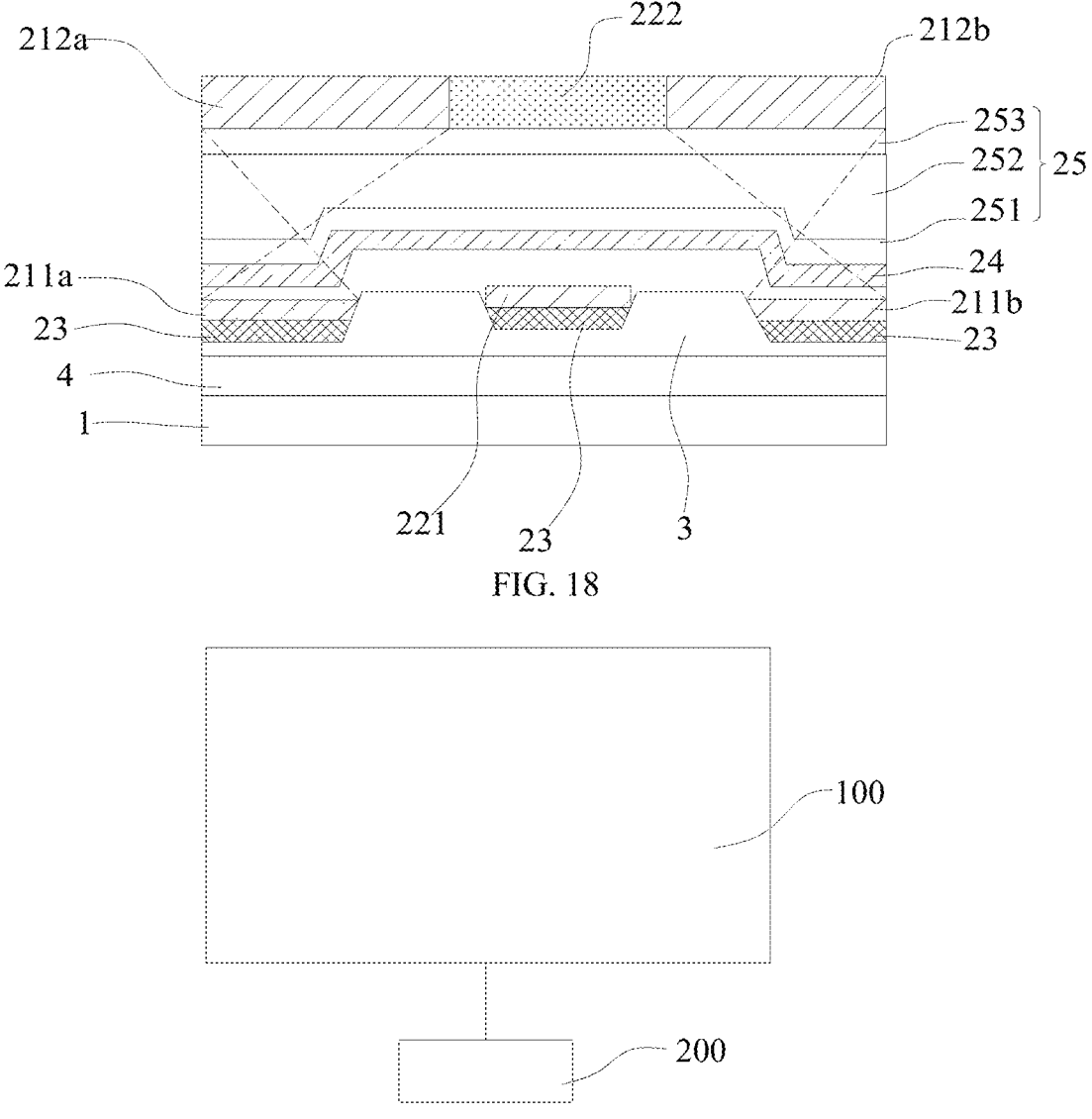
FIG. 18 shows light emission directions of first and second organic light-emitting layers in the anti-peeping mode according to Embodiment 2 or Embodiment 3 of the present application.
FIG. 19 is a schematic structural diagram of connection of a main board and the display panel according to Embodiment 3 of the present application.

Furthermore, as shown in FIGS. 17 and 18, in an anti-peeping mode, when the first display organic light-emitting layer 211*a* and the second display organic light-emitting layer 211*b* emit light, the anti-peeping organic light-emitting layer 221 does not emit light. Alternatively, when the first display organic light-emitting layer 211*a* and the second display organic light-emitting layer 211*b* do not emit light, the anti-peeping organic light-emitting layer 221 emits light.

It can be understood that, as shown in FIG. 18, when the first display organic light-emitting layer 211*a* and the second display organic light-emitting layer 211*b* emit light while the anti-peeping organic light-emitting layer 221 does not emit light, part of the light emitted by the first display organic light-emitting layer 211*a* and the second display organic light-emitting layer 211*b* pass through the first display color filtering layer 212*a* and the second display color filtering layer 212*b*, and the rest are blocked by the anti-peeping color filtering layer 222, so that the light emitting amounts of the first display color filtering layer 212*a* and the second display color filtering layer 212*b* are reduced, as a result, a large angle of view display is abnormal, which interferes with the reading of information at the large angle of view, thereby achieving an anti-peeping effect.

Accordingly, as shown in FIG. 17, when the first display organic light-emitting layer 211*a* and the second display organic light-emitting layer 211*b* do not emit light while the anti-peeping organic light-emitting layer 221 emits light, the light emitted by the anti-peeping organic light-emitting layer 221 is output from the first display color filtering layer 212*a* and the second display color filtering layer 212*b*, so that the light emitting amounts of the first display color filtering layer 212*a* and the second display color filtering layer 212*b* are reduced, and the light emitting amount at a large angle of view is reduced, as a result, a large angle of view display is abnormal, which interferes with the reading of information at the large angle of view, thereby achieving an anti-peeping effect.

In the present application, the normal display mode and the anti-peeping display mode can be switched by switching the light-emitting states of the first display organic light-emitting layer 211*a*, the second display organic light-emitting layer 211*b* and the anti-peeping organic light-emitting layer 221, therefore, the switching between the anti-peeping mode and normal display mode is simpler.

The rest of the structures are referred to in Embodiment 1 and will not be detailed here.

Embodiment 3

As shown in FIG. 19, the present application also provides a display device including a display panel 100 and a mainboard 200. The mainboard 200 is connected to the display panel 100 and configured to drive the display panel 100 to display screens. The display panel 100 includes the display panel 100 disclosed in Embodiment 1 or Embodiment 2, which will not be detailed here, and for details, please refer to Embodiment 1 or Embodiment 2.

The display device may be any electronic device with a display function, such as a mobile phone, a tablet, a laptop, an e-reader or a television.

In the description of the Description, the description with reference to terms of "some embodiments and "example" and the like means that specific features, structures, materials, or characteristics described in combination with the embodiment(s) or example(s) are included in at least one embodiment or example of the present application. In the description, the schematic expressions of the above terms do not necessarily refer to the same embodiment or example. Furthermore, the specific features, structures, materials or characteristics described may be combined in an appropriate manner in any one or more embodiments or examples. In addition, in a non-contradictory case, those skilled in the art may unite and combine different embodiments or examples described in this description and the characteristics of the different embodiments or examples.

Although the embodiments of the present application have been shown and described above, it is understood that such embodiments are exemplary and should not be construed as a limitation of the present application, and such embodiments may be varied, modified, replaced and modified within the scope of the present application by persons of ordinary skill in the art, therefore, any variations or modifications made in accordance with the claims and description of the present application shall be contemplated by the present application for a patent.

What is claimed is:

1. A display panel, comprising a substrate and a plurality of pixel components formed on the substrate and arranged in an array, wherein each of plurality of the pixel components comprises a plurality of sub-pixels, at least one of the plurality of sub-pixels is an anti-peeping sub-pixel, and each anti-peeping sub-pixel comprises:

a normal display part comprising a display organic light-emitting layer and a display color filtering layer, wherein the display color filtering layer is arranged on a side of the display organic light-emitting layer away from the substrate; and an anti-peeping part, wherein at least two opposite sides of the anti-peeping part are provided with a normal display part, and the anti-peeping part comprising an anti-peeping organic light-emitting layer and an anti-peeping color filtering layer, wherein the anti-peeping color filtering layer is arranged on a side of the anti-peeping organic light-emitting layer away from the substrate, wherein light emitted by the anti-peeping organic light-emitting layer and light emitted by the display organic light-emitting layer are same in color, and the anti-peeping color filtering layer and the display color filtering layer are different in color, wherein the display color filtering layer is configured to allow the light emitted by the anti-peeping organic light-emitting layer and the light emitted by the display organic light-emitting layer to pass through, and wherein the anti-peeping color filtering layer is connected to the display color filtering layer;

wherein, in a normal display mode, the display organic light-emitting layer and the anti-peeping organic light-emitting layer emit light simultaneously or be lightless simultaneously; and wherein in an anti-peeping mode, one of the display organic light-emitting layer and the anti-peeping organic light-emitting layer emits light, and the other is lightless.

2. The display panel according to claim 1, wherein the normal display part is arranged around the anti-peeping part, and connected to the anti-peeping part.

3. The display panel according to claim 1, wherein the display organic light-emitting layer, the display color filtering layer and the anti-peeping organic light-emitting layer are blue, and the anti-peeping color filtering layer is red; or wherein the display organic light-emitting layer, the display color filtering layer and the anti-peeping organic light-emitting layer are red, and the anti-peeping color filtering layer is blue.

4. The display panel according to claim 3, wherein each of the plurality of pixel components comprises a first sub-pixel, a second sub-pixel and the anti-peeping sub-pixel, wherein the first sub-pixel and the second sub-pixel are different in color, and the display color filtering layer of the first sub-pixel, the display color filtering layer of the second sub-pixel and the display color filtering layer of the anti-peeping sub-pixel are different in color; and wherein, the anti-peeping sub-pixel and the second sub-pixel are arranged successively in a same column, and the first sub-pixel is located in a column adjacent to the column in which the second sub-pixel and the anti-peeping sub-pixel are located, and arranged opposite to the anti-peeping sub-pixel and the second sub-pixel.

5. The display panel according to claim 4, wherein an edge line of the anti-peeping sub-pixel away from the second sub-pixel is flush with an edge line of the first sub-pixel, wherein an edge line of the second sub-pixel away from the anti-peeping sub-pixel is flush with the other edge line of the first sub-pixel, and wherein an edge line of the second sub-pixel away from the first sub-pixel is flush with an edge line of the anti-peeping sub-pixel.

6. The display panel according to claim 1, wherein an orthographic projection of the anti-peeping organic light-emitting layer on the substrate is located in an orthographic projection of the anti-peeping color filtering layer on the substrate; and wherein an orthographic projection of the display organic light-emitting layer on the substrate is located in an orthographic projection of the display color filtering layer on the substrate.

7. The display panel according to claim 4, wherein the anti-peeping color filtering layer and the display color filtering layer of the sub-pixel which has same color as that of the anti-peeping color filtering layer are arranged in a same layer.

8. The display panel according to claim 1, wherein each normal display part and each anti-peeping part further comprises an anode and a cathode, respectively;

the anode of the normal display part is arranged on a side of the display organic light-emitting layer adjacent to the substrate, and the cathode of the normal display part is arranged on a side of the display organic light-emitting layer away from the substrate; and wherein the anode of the anti-peeping part is arranged on a side of the anti-peeping organic light-emitting layer adjacent to the substrate, and the cathode of the anti-peeping part is arranged on a side of the anti-peeping organic light-emitting layer away from the substrate;

wherein the anode of the anti-peeping part and the anode of the normal display part are independent of each other.

9. The display panel according to claim 8, wherein the cathode of the normal display part and the cathode of the anti-peeping part are connected with each other to form a whole-surface electrode.

10. The display panel according to claim 8, wherein the anode of each anti-peeping part are connected to each other.

11. The display panel according to claim 1, wherein further comprises a pixel definition layer, wherein the anti-peeping organic light-emitting layer and the display organic light-emitting layer are both located on a side of the pixel definition layer away from the substrate, wherein the bottom of the anti-peeping organic light-emitting layer is higher than the bottom of the display organic light-emitting layer.

12. The display panel according to claim 11, wherein the anti-peeping organic light-emitting layer and the display organic light-emitting layer are separated by the pixel definition layer.

13. A display device, comprising a display panel and a mainboard, wherein the mainboard is connected to the display panel;

wherein the display device comprises a substrate and a plurality of pixel components formed on the substrate and arranged in an array, wherein each of the plurality of pixel components comprises a plurality of sub-pixels, at least one of the plurality of sub-pixels is an anti-peeping sub-pixel, and each anti-peeping sub-pixel comprises:

a normal display part comprising a display organic light-emitting layer and a display color filtering layer, wherein the display color filtering layer is arranged on a side of the display organic light-emitting layer away from the substrate; and an anti-peeping part, wherein at least two opposite sides of the anti-peeping part are provided with a normal display part, and the anti-peeping part comprising an anti-peeping organic light-emitting layer and an anti-peeping color filtering layer, wherein the anti-peeping color filtering layer is arranged on a side of the anti-peeping organic light-emitting layer away from the substrate, wherein light emitted by the anti-peeping organic light-emitting layer and light emitted by the display organic light-emitting layer are same in color, and the anti-peeping color filtering layer and the display color filtering layer are different in color, wherein the display color filtering layer is configured to allow the light emitted by the anti-peeping organic light-emitting layer and the light emitted by the display organic light-emitting layer to pass through, and wherein the anti-peeping color filtering layer is connected to the display color filtering layer;

wherein, in a normal display mode, the display organic light-emitting layer and the anti-peeping organic light-emitting layer emit light simultaneously or be lightless simultaneously; and wherein in an anti-peeping mode, one of the display organic light-emitting layer and the anti-peeping organic light-emitting layer emits light, and the other is lightless.

14. The display device according to claim 13, wherein the normal display part is arranged around the anti-peeping part, and connected to the anti-peeping part.

15. The display device according to claim 13, wherein the display organic light-emitting layer, the display color filtering layer and the anti-peeping organic light-emitting layer are blue, and the anti-peeping color filtering layer is red; or wherein the display organic light-emitting layer, the display color filtering layer and the anti-peeping organic light-emitting layer are red, and the anti-peeping color filtering layer is blue.

16. The display device according to claim 15, wherein each of the plurality of pixel components comprises a first sub-pixel, a second sub-pixel and the anti-peeping sub-pixel, wherein the first sub-pixel and the second sub-pixel are different in color, and the display color filtering layer of the first sub-pixel, the display color filtering layer of the second sub-pixel and the display color filtering layer of the anti-peeping sub-pixel are different in color; and wherein, the anti-peeping sub-pixel and the second sub-pixel are arranged successively in a same column, and the first sub-pixel is located in a column adjacent to the column in which the second sub-pixel and the anti-peeping sub-pixel are located, and arranged opposite to the anti-peeping sub-pixel and the second sub-pixel.

17. The display device according to claim 16, wherein an edge line of the anti-peeping sub-pixel away from the second sub-pixel is flush with an edge line of the first sub-pixel, wherein an edge line of the second sub-pixel away from the anti-peeping sub-pixel is flush with the other edge line of the first sub-pixel, and wherein an edge line of the second sub-pixel away from the first sub-pixel is flush with an edge line of the anti-peeping sub-pixel.

18. The display device according to claim 13, wherein an orthographic projection of the anti-peeping organic light-emitting layer on the substrate is located in an orthographic projection of the anti-peeping color filtering layer on the substrate; and wherein an orthographic projection of the display organic light-emitting layer on the substrate is located in an orthographic projection of the display color filtering layer on the substrate.

19. The display device according to claim 16, wherein the anti-peeping color filtering layer and the display color filtering layer of the sub-pixel which has same color as that of the anti-peeping color filtering layer are arranged in a same layer.

20. The display device according to claim 13, wherein each normal display part and each anti-peeping part further comprises an anode and a cathode, respectively;

the anode of the normal display part is arranged on a side of the display organic light-emitting layer adjacent to the substrate, and the cathode of the normal display part is arranged on a side of the display organic light-emitting layer away from the substrate; and wherein the anode of the anti-peeping part is arranged on a side of the anti-peeping organic light-emitting layer adjacent to the substrate, and the cathode of the anti-peeping part is arranged on a side of the anti-peeping organic light-emitting layer away from the substrate; wherein the anode of the anti-peeping part and the anode of the normal display part are independent of each other.

\* \* \* \* \*